(12) United States Patent
Yuan et al.

(10) Patent No.: US 12,376,455 B2
(45) Date of Patent: Jul. 29, 2025

(54) DISPLAY SUBSTRATE AND DISPLAY DEVICE

(71) Applicants: HEFEI BOE JOINT TECHNOLOGY CO., LTD., Hefei (CN); BOE TECHNOLOGY GROUP CO., LTD., Beijing (CN)

(72) Inventors: Can Yuan, Beijing (CN); Yongqian Li, Beijing (CN); Zhidong Yuan, Beijing (CN); Pan Xu, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/754,369

(22) PCT Filed: Apr. 30, 2021

(86) PCT No.: PCT/CN2021/091429
§ 371 (c)(1),
(2) Date: Mar. 30, 2022

(87) PCT Pub. No.: WO2022/226985
PCT Pub. Date: Nov. 3, 2022

(65) Prior Publication Data
US 2024/0057407 A1 Feb. 15, 2024

(51) Int. Cl.
*H10K 59/131* (2023.01)
*H10K 59/121* (2023.01)
(52) U.S. Cl.
CPC ..... *H10K 59/1213* (2023.02); *H10K 59/1216* (2023.02); *H10K 59/131* (2023.02)

(58) Field of Classification Search
None
See application file for complete search history.

(56) References Cited

U.S. PATENT DOCUMENTS

2012/0161125 A1 6/2012 Yamazaki
2020/0176576 A1* 6/2020 Lee ..................... H01L 27/1222
(Continued)

FOREIGN PATENT DOCUMENTS

CN 111524945 A 8/2020
WO 2021218438 A1 11/2021

OTHER PUBLICATIONS

Extended European Search Report issued Feb. 16, 2024 from EPO for European application No. 21938459.1, 12 pages.

*Primary Examiner* — William C Trapanese
(74) *Attorney, Agent, or Firm* — Kinney & Lange, P.A.

(57) ABSTRACT

A display substrate and a display device are provided. The display substrate includes: a plurality of pixel units arranged on a base substrate, each pixel unit includes a plurality of sub-pixels, and each sub-pixel includes a light emitting element and a pixel driving circuit; a semiconductor layer arranged on the base substrate; a first conductive layer arranged on a side of the semiconductor layer; and a second conductive layer arranged on another side of the semiconductor layer. The pixel driving circuit includes a driving transistor, a switching transistor and a sensing transistor; the switching transistor includes a first gate electrode and a first active layer; the display substrate further includes a channel defining portion for defining a channel region of the switching transistor, and an orthographic projection of the channel defining portion at least partially overlaps an orthographic projection of the first active layer on the base substrate.

20 Claims, 14 Drawing Sheets

(56) References Cited

U.S. PATENT DOCUMENTS

| | | |
|---|---|---|
| 2020/0350341 A1 | 11/2020 | Hanada et al. |
| 2021/0098557 A1* | 4/2021 | Lee .................. H10K 59/88 |
| 2023/0006023 A1 | 1/2023 | Yuan et al. |

* cited by examiner

30&10&via hole&ACT&20&via hole&40&via hole

30&10&via hole&ACT&20&via hole&40&via hole&300

DISPLAY SUBSTRATE AND DISPLAY DEVICE

CROSS-REFERENCE TO RELATED APPLICATION

This application is a Section 371 National Stage Application of International Application No. PCT/CN2021/091429, filed on Apr. 30, 2021, entitled "DISPLAY SUBSTRATE AND DISPLAY DEVICE", incorporated herein by reference in its entirety.

TECHNICAL FIELD

The present disclosure relates to a field of display technology, in particular to a display substrate and a display device.

BACKGROUND

A light emission uniformity is one of important indicators to measure a quality of a display panel. In an existing display panel, there is a phenomenon of a non-uniform light emission, that is, a poor light emission uniformity. For example, in an OLED display panel, uncontrollable factors such as a process instability, a parameter drift and a device aging, etc. of TFT and OLED light emitting device lead to a change in an OLED current, which may result in a non-uniform light emission of the display panel.

It should be noted that the information disclosed in the Background section is only for enhancement of understanding of the background of the present disclosure, and therefore may contain information that does not form a related art that is already known to those skilled in the art.

SUMMARY

In an aspect, there is provided a display substrate, including: a base substrate; a plurality of pixel units arranged on the base substrate, wherein each pixel unit includes a plurality of sub-pixels, and each sub-pixel includes a light emitting element and a pixel driving circuit for driving the light emitting element; a semiconductor layer arranged on the base substrate; a first conductive layer arranged on a side of the semiconductor layer close to the base substrate; and a second conductive layer arranged on a side of the semiconductor layer away from the base substrate, wherein the pixel driving circuit includes at least a driving transistor, a switching transistor and a sensing transistor; the switching transistor includes a first gate electrode located in the first conductive layer and a first active layer located in the semiconductor layer; the driving transistor includes a second gate electrode located in the second conductive layer and a second active layer located in the semiconductor layer; the sensing transistor includes a third gate electrode located in the second conductive layer and a third active layer located in the semiconductor layer; the display substrate further includes a channel defining portion for defining a channel region of the switching transistor, the channel defining portion is located in the second conductive layer, and an orthographic projection of the channel defining portion on the base substrate at least partially overlaps an orthographic projection of the first active layer on the base substrate.

According to some exemplary embodiments, the orthographic projection of the channel defining portion on the base substrate falls within an orthographic projection of the first gate electrode on the base substrate.

According to some exemplary embodiments, the first active layer extends in a first direction, and the second active layer and the third active layer extend in a second direction intersecting the first direction.

According to some exemplary embodiments, the display substrate further includes a first power signal line for transmitting a first power signal, wherein the display substrate further includes a third conductive layer located on a side of the first conductive layer close to the base substrate, and the first power signal line is located in the third conductive layer.

According to some exemplary embodiments, the display substrate further includes a sensing signal line for transmitting a sensing signal, wherein the sensing transistor includes a source electrode and a drain electrode, the sensing signal line is electrically connected to the source electrode or the drain electrode of the sensing transistor, and the sensing signal line is located in the third conductive layer.

According to some exemplary embodiments, the pixel driving circuit further includes a storage capacitor including a first capacitor; and the display substrate includes a first conductive portion located in the first conductive layer and a second conductive portion located in the second conductive layer, an orthographic projection of at least a part of the first conductive portion on the base substrate overlaps an orthographic projection of at least a part of the second conductive portion on the base substrate, and an overlapping part of the first conductive portion and the second conductive portion forms the first capacitor.

According to some exemplary embodiments, the storage capacitor further includes a second capacitor connected in parallel with the first capacitor; the display substrate further includes a fourth conductive layer located on a side of the second conductive layer away from the base substrate; the display substrate further includes a third conductive portion located in the fourth conductive layer and a fourth conductive portion located in the semiconductor layer, and the fourth conductive portion includes a conductorized part in the semiconductor layer; an orthographic projection of at least a part of the third conductive portion on the base substrate overlaps an orthographic projection of at least a part of the fourth conductive portion on the base substrate, and an overlapping part of the third conductive portion and the fourth conductive portion forms the second capacitor.

According to some exemplary embodiments, the fourth conductive portion is electrically connected to the first conductive portion through a first via hole, and the third conductive portion is electrically connected to the second conductive portion through a second via hole.

According to some exemplary embodiments, the display substrate further includes a first scanning signal line located in the first conductive layer, wherein the first scanning signal line is spaced apart from the first conductive portion; and an overlapping part of the first scanning signal line and the semiconductor layer forms the first gate electrode.

According to some exemplary embodiments, the first scanning signal line and the sensing signal line extend in the first direction; and/or the first power signal line and the first conductive portion extend in the second direction.

According to some exemplary embodiments, the display substrate further includes a fifth conductive portion located in the semiconductor layer; the second active layer, the third active layer, the fourth conductive portion and the fifth conductive portion are formed as an integral part continuously extending in the semiconductor layer; and the first active layer is spaced apart from the integral part.

According to some exemplary embodiments, a part of the third active layer is electrically connected to the sensing signal line through a third via hole, and a part of the fifth conductive portion is electrically connected to the first power signal line through a four via hole.

According to some exemplary embodiments, the display substrate further includes a second scanning signal line located in the second conductive layer, wherein the second scanning signal line is arranged parallel to the first scanning signal line; the second scanning signal line, the second conductive portion and the channel defining portion are spaced apart from each other; and an overlapping part of the second conductive portion and the second active layer forms the second gate electrode, and an overlapping part of the second scanning signal line and the third active layer forms the third gate electrode.

According to some exemplary embodiments, the display substrate further includes a data line located in the fourth conductive layer; the data line is spaced apart from the third conductive portion; and a part of the third conductive portion is electrically connected to one end of the first active layer through a fifth via hole, and a part of the data line is electrically connected to the other end of the first active layer through a sixth via hole.

According to some exemplary embodiments, an orthographic projection of the second conductive portion on the base substrate falls within an orthographic projection of the first conductive portion on the base substrate; and/or a part of the third conductive portion is arranged across the fifth conductive portion.

According to some exemplary embodiments, the fifth conductive portion extends in the first direction, the part of the third conductive portion arranged across the fifth conductive portion extends in the second direction, and the second via hole and the fifth via hole are located on opposite sides of the fifth conductive portion.

According to some exemplary embodiments, the light emitting element includes a first electrode directly electrically connected to the fourth conductive portion through a seventh via hole.

According to some exemplary embodiments, an orthographic projection of the seventh via hole on the base substrate at least partially overlaps an orthographic projection of the second via hole on the base substrate.

According to some exemplary embodiments, the channel defining portion is in a suspended state.

In another aspect, there is provided a display device including the display substrate described above.

BRIEF DESCRIPTION OF THE DRAWINGS

With following description of the present disclosure with reference to the drawings, other objectives and advantages of the present disclosure would be apparent and the present disclosure would be understood comprehensively.

Figure 1A:
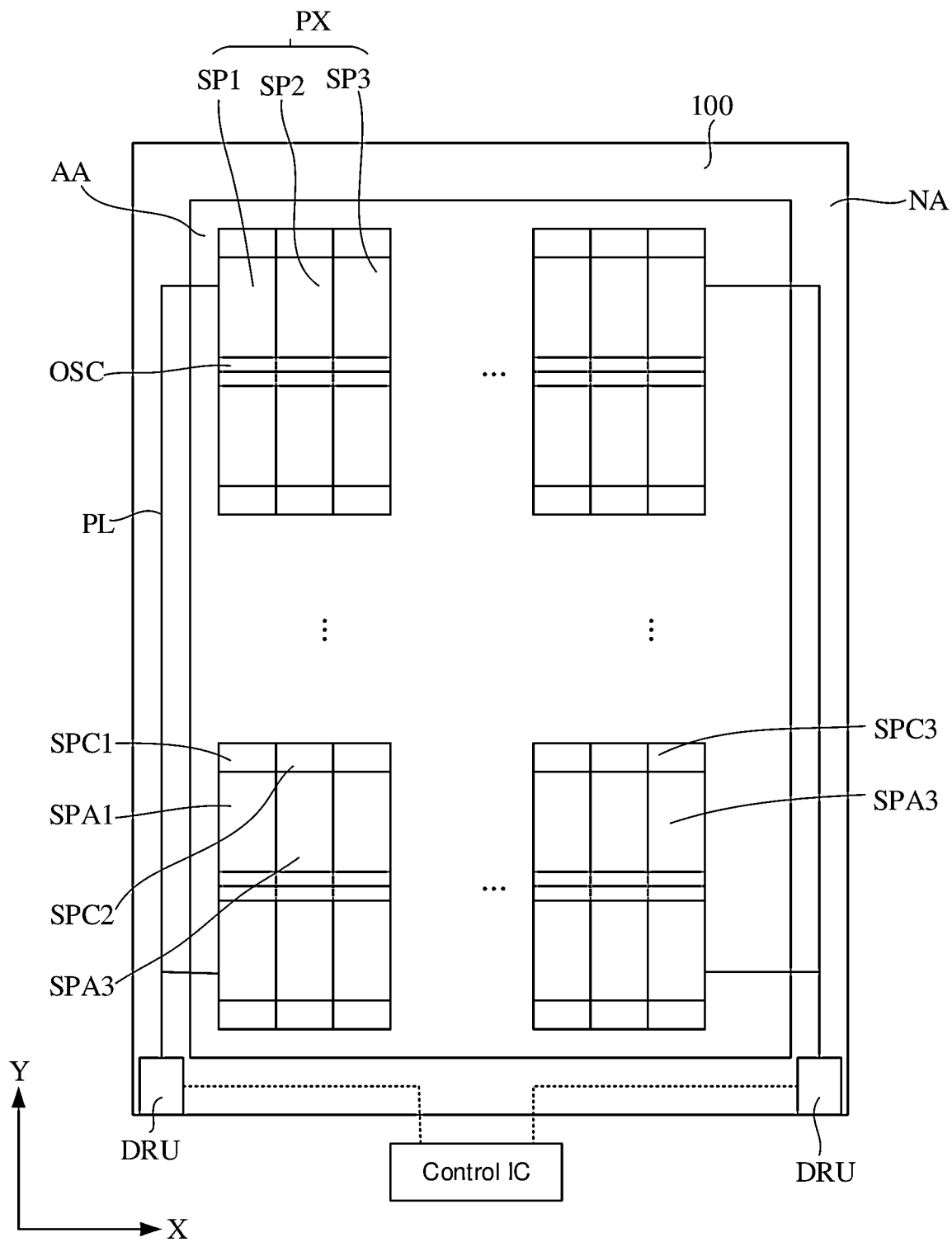
FIG. 1A shows a schematic plan view of a display substrate according to the embodiments of the present disclosure.

It should be noted that for the sake of clarity, in the drawings used to describe the embodiments of the present disclosure, sizes of layers, structures or regions may be enlarged or reduced, that is, these drawings are not drawn according to actual scale.

DETAILED DESCRIPTION OF EMBODIMENTS

The technical solutions of the present disclosure will be further described in detail below through the embodiments and in conjunction with the drawings. In the specification, the same or similar reference numerals indicate the same or similar components. The following description of the embodiments of the present disclosure with reference to the drawings is intended to explain a general inventive concept of the present disclosure, and should not be understood as a limitation of the present disclosure.

In addition, in the following detailed description, for the convenience of explanation, many specific details are set forth to provide a comprehensive understanding of the embodiments of the present disclosure. Apparently, however, one or more embodiments may also be implemented without these specific details.

It should be understood that, although terms "first," "second" and so on may be used herein to describe different elements, these elements should not be limited by these terms. These terms are only used to distinguish one element from another element. For example, without departing from the scope of the exemplary embodiments, a first element may be named as a second element, and similarly, the second element may be named as the first element. A term "and/or" as used here includes any and all combinations of one or more related listed items.

It should be understood that when an element or layer is referred to as being "formed on" another element or layer, the element or layer may be directly or indirectly formed on the other element or layer. That is, for example, an intermediate element or an intermediate layer may exist. In contrast, when an element or layer is referred to as being "directly formed on" another element or layer, no intermediate elements or layers exist. Other terms used to describe a relationship between elements or layers (for example, "between" and "directly between", "adjacent to" and "directly adjacent to", etc.) should be interpreted in a similar manner.

Herein, directional expressions "first direction" and "second direction" are used to describe different directions along a pixel region, e.g., a longitudinal direction and a lateral direction of the pixel region. It should be understood that such expressions are only exemplary descriptions rather than limitations to the present disclosure.

Herein, unless otherwise specified, the expression "located in the same layer" generally means that a first component and a second component may be made of the same material and may be formed by the same patterning process. The expression "A and B are connected as a whole" means that component A and component B are integrally formed, that is, they generally contain the same material and are formed as a structurally continuous integral component.

Transistors used in the embodiments of the present disclosure may all be thin film transistors or field effect transistors or other devices with the same properties. Since source and drain electrodes of the thin film transistor used here are symmetrical, the source and drain electrodes may be interchanged. In the following examples, the driving transistor is described as a P-type thin film transistor, and the other transistors are of the same or different type as or from the driving transistor according to a circuit design. Similarly, in other embodiments, the driving transistor may also be shown as an N-type thin film transistor.

Some exemplary embodiments of the present disclosure provide a display substrate, including: a base substrate; a plurality of pixel units arranged on the base substrate, where each pixel unit includes a plurality of sub-pixels, and each sub-pixel includes a light emitting element and a pixel driving circuit for driving the light emitting element; a semiconductor layer arranged on the base substrate; a first conductive layer arranged on a side of the semiconductor layer close to the base substrate; and a second conductive layer arranged on a side of the semiconductor layer away from the base substrate, where the pixel driving circuit includes at least a driving transistor, a switching transistor and a sensing transistor; the switching transistor includes a first gate electrode located in the first conductive layer and a first active layer located in the semiconductor layer; the driving transistor includes a second gate electrode located in the second conductive layer and a second active layer located in the semiconductor layer; the sensing transistor includes a third gate electrode located in the second conductive layer and a third active layer located in the semiconductor layer. The display substrate further includes a channel defining portion for defining a channel region of the switching transistor, the channel defining portion is located in the second conductive layer, and an orthographic projection of the channel defining portion on the base substrate at least partially overlaps an orthographic projection of the first active layer on the base substrate. In this way, a good property of the formed switching transistor may be ensured.

Figure 1B:
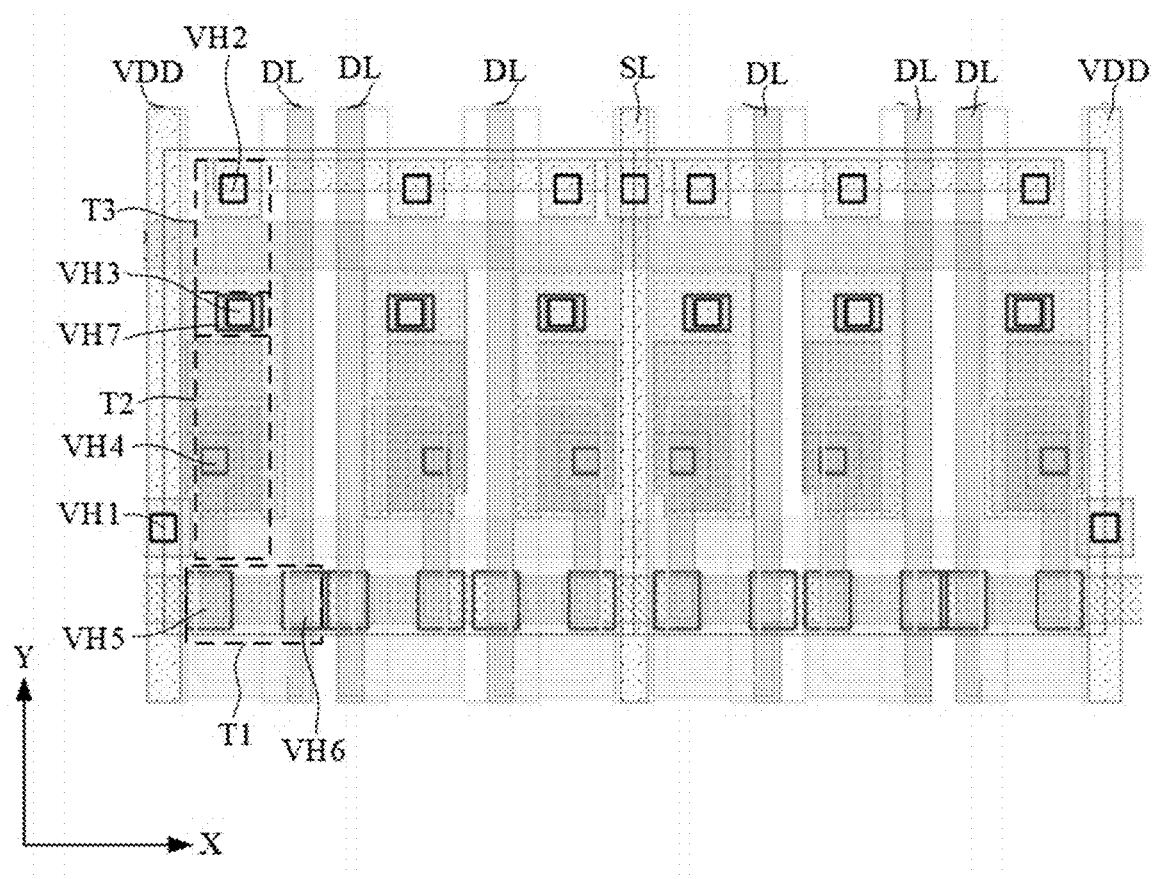
FIG. 1B shows a partial plan view of a display substrate according to the embodiments of the present disclosure, which schematically illustrates more specific structures of the display substrate.

FIG. 1A shows a schematic plan view of the display substrate according to the embodiments of the present disclosure. FIG. 1B shows a partial plan view of the display substrate according to the embodiments of the present disclosure, which schematically illustrates more specific structures of the display substrate. Referring to FIG. 1A and FIG. 1B in combination, the display substrate according to the embodiments of the present disclosure may include a base substrate 100, a pixel unit PX arranged on the base substrate 100, a driving unit DRU arranged on the base substrate 100, and a wire PL electrically connecting the pixel unit PX and the driving unit DRU. The driving unit DRU is used to drive the pixel unit PX.

The display substrate may include a display region AA and a non-display region NA. The display region AA may be a region in which the pixel unit PX for displaying an image is provided. Each pixel unit PX will be described later. The non-display region NA is a region in which no pixel unit PX is provided, that is, a region in which no image is displayed. The driving unit DRU for driving the pixel unit PX and some wires PL connecting the pixel unit PX and the driving unit DRU may be provided in the non-display region NA. The non-display region NA corresponds to a border in a final display device, and a width of the border may be determined according to a width of the non-display region NA.

The display region AA may have various shapes. For example, the display region AA may be provided in various shapes such as a closed polygon (e.g., a rectangle) including a straight side, a circle or an ellipse including a curved side, and a semicircle or a semi-ellipse including a straight side and a curved side. In the embodiments of the present disclosure, the display region AA is set as a region having a quadrangular shape including straight sides. It should be understood that this is only an exemplary embodiment of the present disclosure rather than a limitation of the present disclosure.

The non-display region NA may be arranged on at least one side of the display region AA. In the embodiments of the present disclosure, the non-display region NA may surround a peripheral of the display region AA. In the embodiments of the present disclosure, the non-display region NA may include a lateral part extending in a first direction X and a longitudinal part extending in a second direction Y.

The pixel unit PX is arranged in the display region AA. The pixel unit PX is a minimum unit for displaying an image, and a plurality of pixel units may be provided. For example, the pixel unit PX may include a light emitting device emitting a white light and/or a color light.

A plurality of pixel units PX may be provided in a matrix form along a row extending in the first direction X and a column extending in the second direction Y. However, the embodiments of the present disclosure do not specifically limit an arrangement form of the pixel units PX, and the pixel units PX may be arranged in various forms. For example, the pixel units PX may be arranged such that a direction inclined with respect to the first direction X and the second direction Y is a column direction, and a direction intersecting the column direction is a row direction.

A pixel unit PX may include a plurality of sub-pixels. For example, a pixel unit PX may include three sub-pixels, namely, a first sub-pixel SP1, a second sub-pixel SP2, and a third sub-pixel SP3. For another example, a pixel unit PX may include four sub-pixels, namely, the first sub-pixel SP1, the second sub-pixel SP2, the third sub-pixel SP3, and a fourth sub-pixel. For example, the first sub-pixel SP1 may be a red sub-pixel, the second sub-pixel SP2 may be a green sub-pixel, the third sub-pixel SP3 may be a blue sub-pixel, and the fourth sub-pixel may be a white sub-pixel.

Each sub-pixel may include a light emitting element and a pixel driving circuit for driving the light emitting element. For example, the first sub-pixel SP1 may include a first light emitting element located in a first light emitting region SPA1 and a first pixel driving circuit SPC1 for driving the first light emitting element, and the first light emitting element may emit a red light; the second sub-pixel SP2 may include a second light emitting element located in a second light emitting region SPA2 and a second pixel driving circuit SPC2 for driving the second light emitting element, and the second light emitting element may emit a green light; the third sub-pixel SP3 may include a third light emitting element located in a third light emitting region SPA3 and a third pixel driving circuit SPC3 for driving the third light emitting element, and the third light emitting element may emit a blue light.

The light emitting region of the sub-pixel may be a region where the light emitting element of the sub-pixel is located. For example, in an OLED display panel, a light emitting element of a sub-pixel may include a first electrode (e.g., an anode), a luminescent material layer and a second electrode (e.g., a cathode) arranged in a stack. Therefore, the light emitting region of the sub-pixel may be a region corresponding to a part of the luminescent material layer sandwiched between the anode and the cathode.

The sub-pixel may further include a non-light emitting region, for example, the pixel driving circuit of the sub-pixel is located in the non-light emitting region of the sub-pixel. A ratio of an area of the light emitting region of each sub-pixel to an overall area of the sub-pixel (a sum of the area of the light emitting region and an area of the non-light emitting region) determines an opening ratio of the sub-pixel.

A light emitting device of OLED (such as a light emitting layer, referred to as an EL layer for short) may not have a good uniformity during fabrication. For example, when fabricating the EL layer by an evaporation process, the EL layers of various sub-pixels may be inconsistent due to a limitation of the evaporation process, which results in a non-uniform luminance or chromaticity of different sub-pixels. Moreover, with an increase of use time, the EL layer may age to different degrees, so that the EL layers of various sub-pixels may be inconsistent, which results in the non-uniform luminance or chromaticity of different sub-pixels. In the embodiments of the present disclosure, the display substrate may further include a photosensitive circuit OSC that may sense a light actually emitted by the pixel unit. In this way, in the embodiments of the present disclosure, the display substrate may perform an optical compensation on the sub-pixel in each pixel unit based on the light actually emitted by the pixel unit sensed by the photosensitive circuit OSC, so as to improve the light emission uniformity of the display substrate.

For example, in some exemplary embodiments of the present disclosure, each pixel unit PX is provided with a photosensitive circuit OSC. Each photosensitive circuit OSC may sense the light actually emitted by the pixel unit PX in which the photosensitive circuit OSC is located.

For example, in the embodiments of the present disclosure, at least two pixel units PX may share a photosensitive circuit OSC. Referring to FIG. 1A and FIG. 1B, in pixel units in the same column, two pixel units PX located in two adjacent rows may share a photosensitive circuit OSC. In this way, it is not necessary to provide each pixel unit PX with a photosensitive circuit, and the number of photosensitive circuits may be reduced, so that the opening ratio may be increased.

When the display substrate is in a display state, the photosensitive circuit OSC may sense the light actually emitted by two pixel units adjacent thereto. For example, the photosensitive circuit OSC may include at least a photoelectric conversion element (which will be described further below). In this way, the photosensitive circuit OSC may be configured to sense the light actually emitted by the two pixel units adjacent thereto and transmit a sensing electrical signal according to the sensed light.

For another example, referring to FIG. 1A, the photosensitive circuit OSC may transmit the sensing electrical signal to an external circuit, such as a control IC of a display device. The control IC may control, according to the sensing electrical signal, a control signal transmitted to the pixel unit PX, for example, control a data signal transmitted to the pixel driving circuit of each sub-pixel. Under the control of the data signal, each sub-pixel emits light accordingly.

In the embodiments shown in FIG. 1A and FIG. 1B, the sub-pixels SP1, SP2 and SP3 are arranged side by side and have respective data lines DL.

Figure 2A:
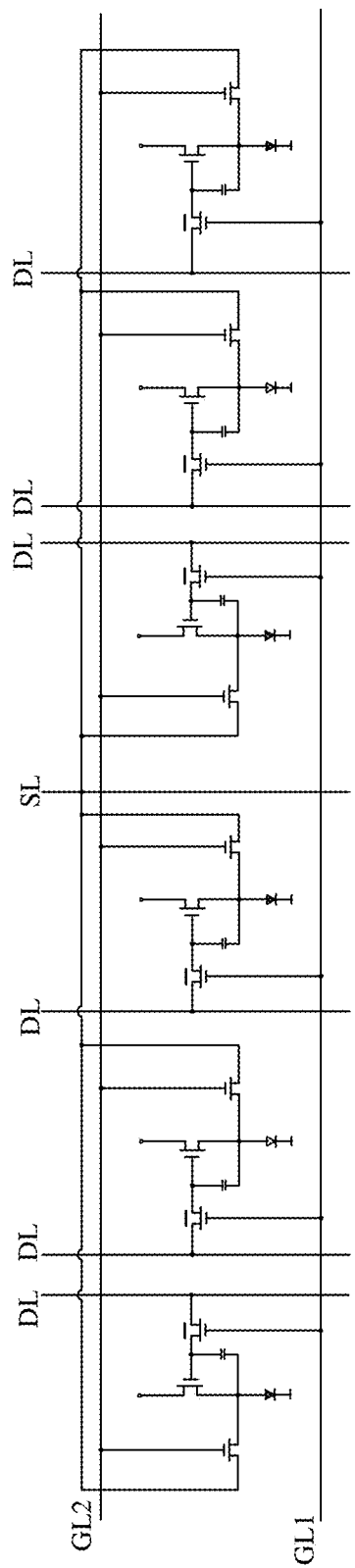
FIG. 2A shows an equivalent circuit diagram of a pixel driving circuit of a plurality of sub-pixels of the display substrate in FIG. 1B.
Figure 2B:
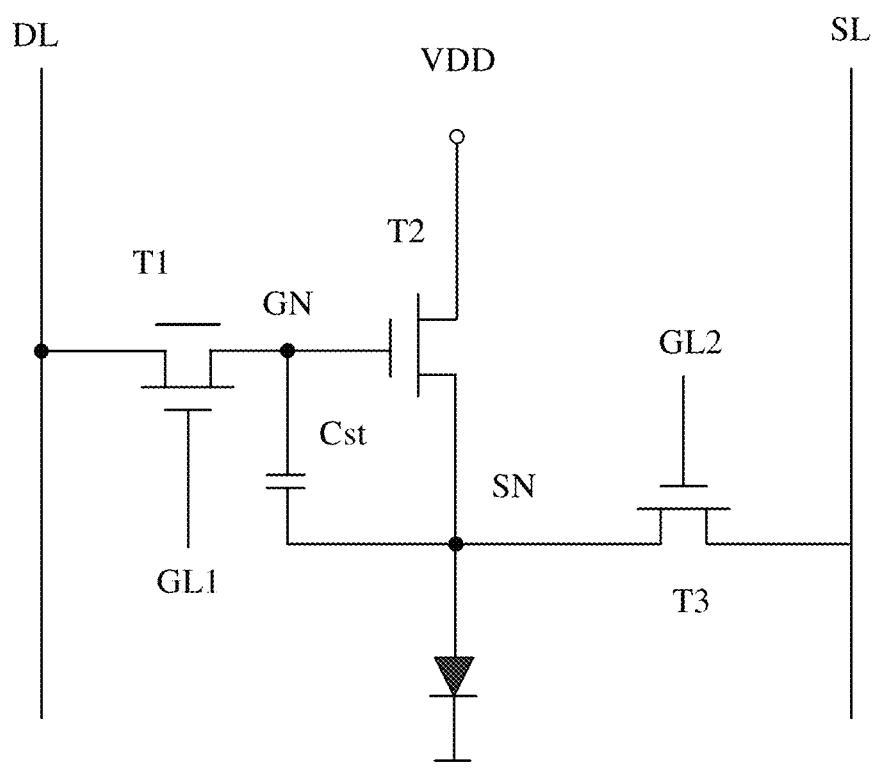
FIG. 2B shows an equivalent circuit diagram of a pixel circuit of a single sub-pixel of the display substrate in FIG. 1B.

FIG. 2A shows an equivalent circuit diagram of a pixel driving circuit of the plurality of sub-pixels of the display substrate in FIG. 1B. FIG. 2B shows an equivalent circuit diagram of a pixel circuit of a single sub-pixel of the display substrate in FIG. 1B. The pixel driving circuit shown in FIG. 2B may be any one of the pixel driving circuits SPC1, SPC2 and SPC3 described above. Referring to FIG. 2A and FIG. 2B, the pixel driving circuit may include a plurality of elements such as a switching transistor T1, a driving transistor T2, a sensing transistor T3 and a storage capacitor Cst1. The pixel driving circuit may be referred to as a 3T1C structure.

It should be noted that the 3T1C structure is illustrated here by way of example in describing the pixel driving circuit included in the display substrate according to the embodiments of the present disclosure, but the pixel driving circuit included in the display substrate in the embodiments of the present disclosure is not limited to the 3T1C structure.

Continuing to refer to FIG. 2B, the switching transistor T1 has a gate electrode connected to the first scanning signal line GL1, a first electrode connected to the data line DL, and a second electrode connected to a gate electrode of the driving transistor T2. For example, the second electrode of the switching transistor T1 and the gate electrode of the driving transistor T2 may be electrically connected to a node GN. The switching transistor T1 is used to control a writing of a voltage signal from the data line DL to the pixel driving circuit.

It should be noted that each transistor may include an active layer, a gate electrode, a first electrode (e.g., a source electrode) and a second electrode (e.g., a drain electrode). For example, the switching transistor T1 includes a first gate electrode G1 and a first active layer ACT1; the driving transistor T2 includes a second gate electrode G2 and a second active layer ACT2; the sensing transistor T3 includes a third gate electrode G3 and a third active layer ACT3. In the embodiments of the present disclosure, the active layers of the transistors may be located in the semiconductor layer, and the gate electrodes may be located in different conductive layers.

It should be noted that herein, the first electrode of the transistor may refer to one of the source electrode and the drain electrode of the transistor, and the second electrode of the transistor may refer to the other of the source electrode and the drain electrode of the transistor.

The driving transistor T2 has a gate electrode electrically connected to the node GN, a first electrode connected to a first power signal (e.g., a high voltage level signal VDD), and a second electrode connected to an anode of a light emitting element D1, so that a driving current may be generated according to a voltage signal to drive the light emitting element D1 to emit light. For example, the light emitting element D1 may be an organic light emitting diode (OLED).

Two ends of the storage capacitor Cst1 are respectively connected to the gate electrode and the source electrode of the driving transistor T2, so as to store the voltage signal input from the data line. For example, one end of the storage capacitor Cst1 is electrically connected to the node GN, and the other end of the storage capacitor Cst1 is electrically connected to a node SN. That is, one end of the storage capacitor Cst1, the second electrode of the switching transistor T1 and the gate electrode of the driving transistor T2 are electrically connected to the node GN, while the other end of the storage capacitor Cst1, the second electrode of the driving transistor T2 and the anode of the light emitting element D1 are electrically connected to the node SN.

The sensing transistor T3 has a gate electrode connected to a second scanning signal line GL2, a first electrode connected to the sensing signal line SL, and a second electrode electrically connected to the node SN.

The light emitting element D1 has an anode electrically connected to the node SN and a cathode electrically connected to a low voltage level signal VSS. The level signals VDD and VSS are DC voltage signals used to provide necessary voltages for driving the light emitting element D1 to emit light.

Figure 3:
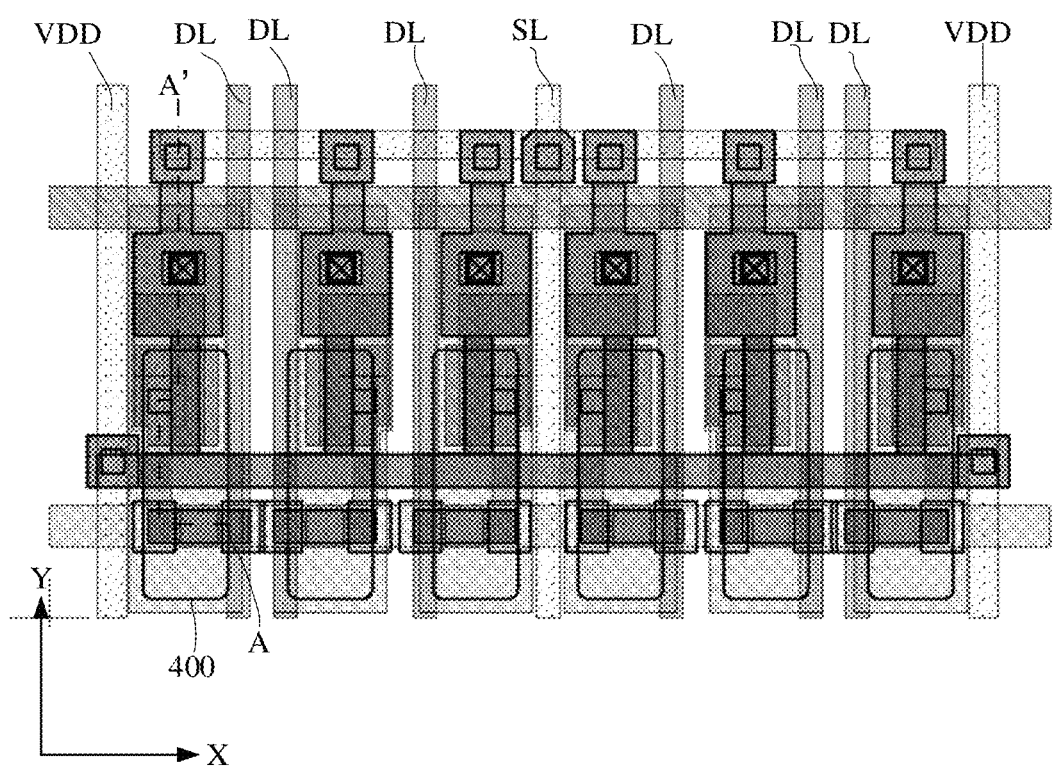
FIG. 3 shows a partial plan view of a display substrate according to some embodiments of the present disclosure, which schematically illustrates a plan view of a pixel driving circuit and a first electrode of a light emitting element included in the display substrate.

FIG. 3 shows a partial plan view of the display substrate according to some embodiments of the present disclosure, which schematically illustrates a plan view of a pixel driving circuit and a first electrode of a light emitting element included in the display substrate. FIG. 4 to FIG. 13 respectively show plan views of a plurality of film layers shown in FIG. 3.

Figure 4:
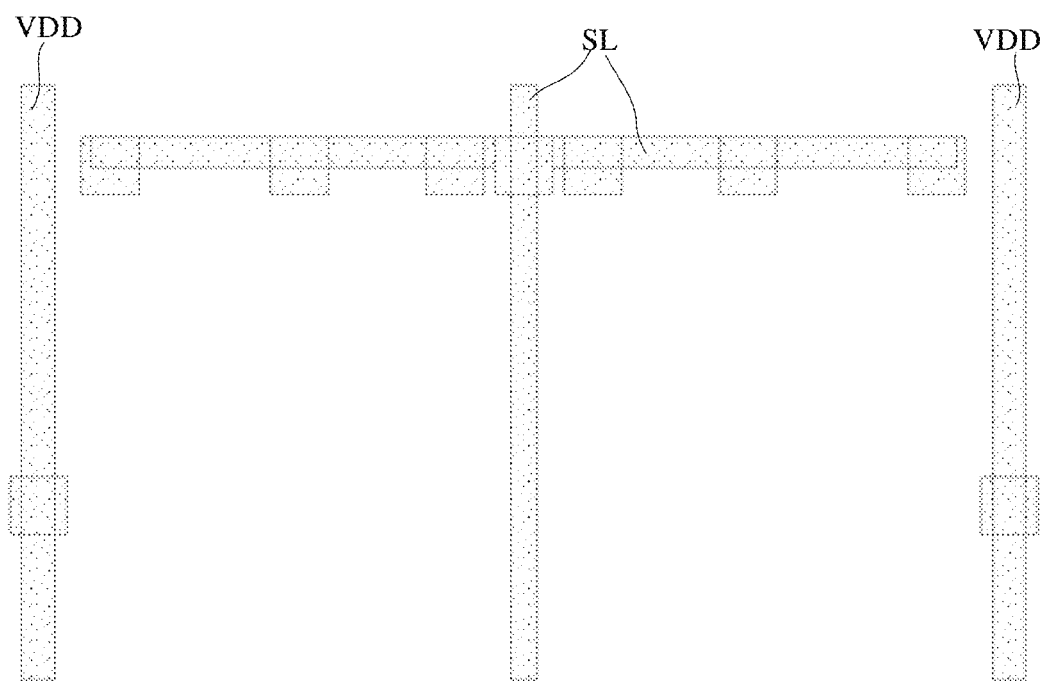
FIG. 4 to FIG. 13 respectively show plan views of a plurality of film layers shown in FIG. 3.
Figure 5:
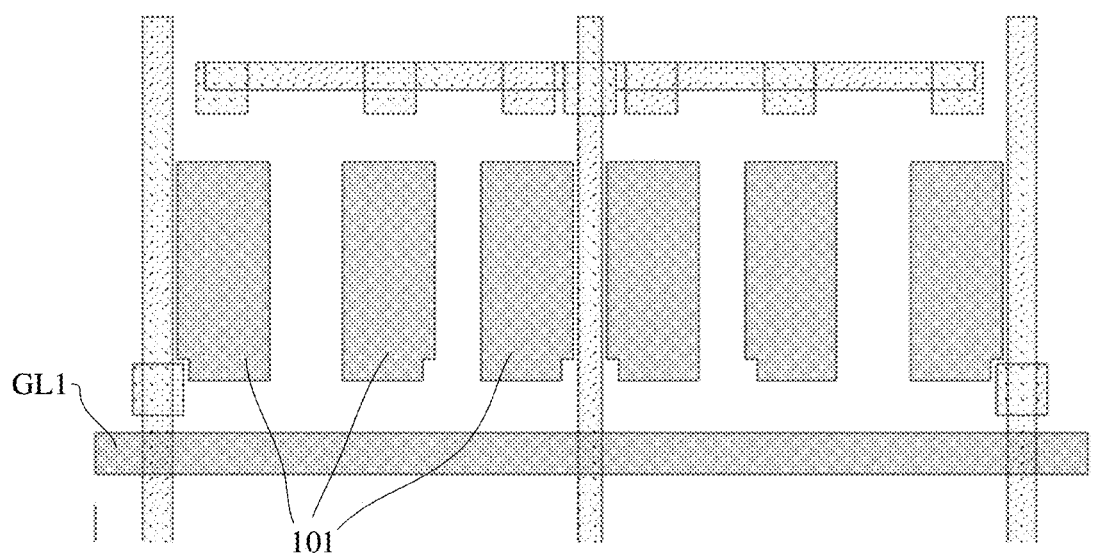
Figure 6:
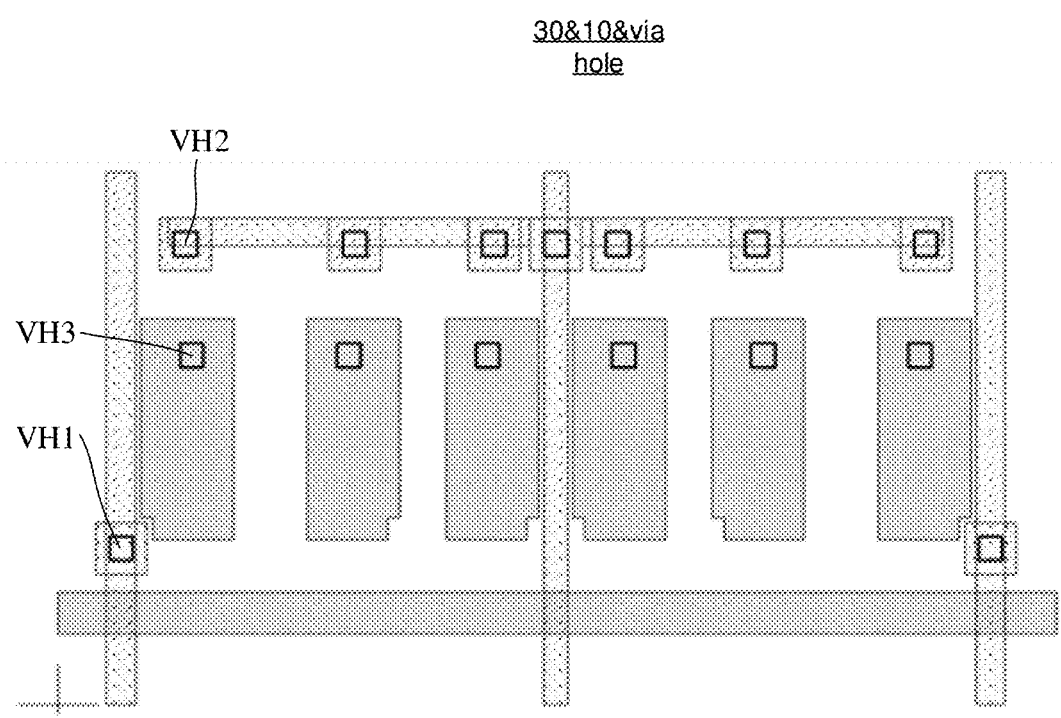
Figure 7:
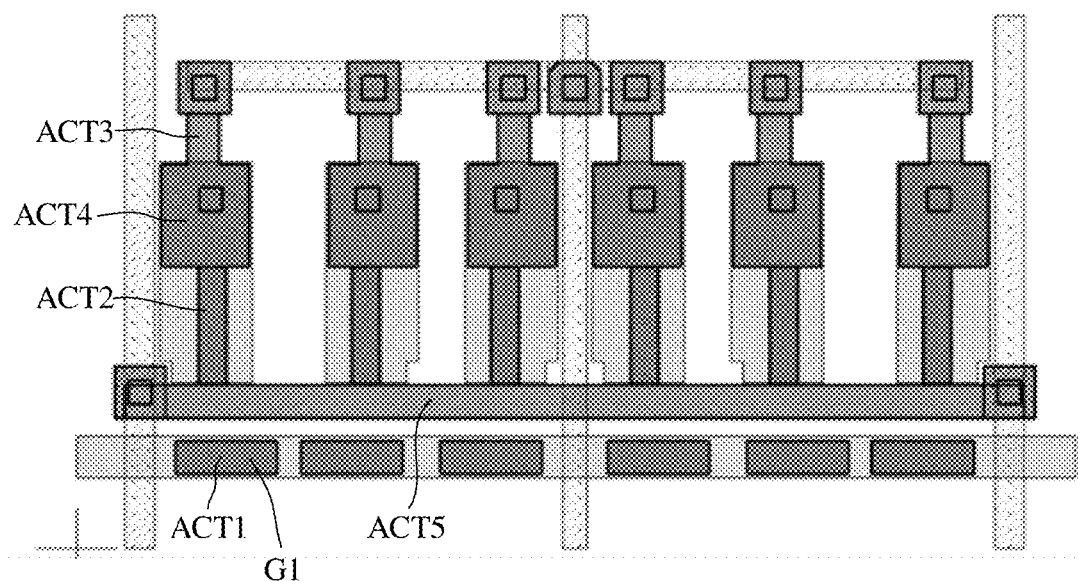
Figure 8:
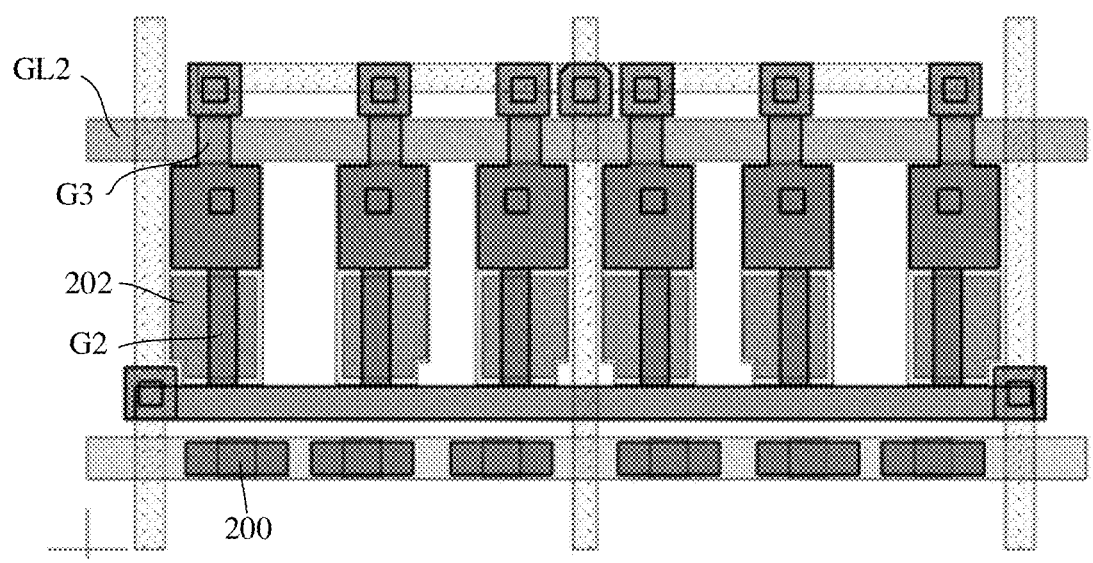
Figure 9:
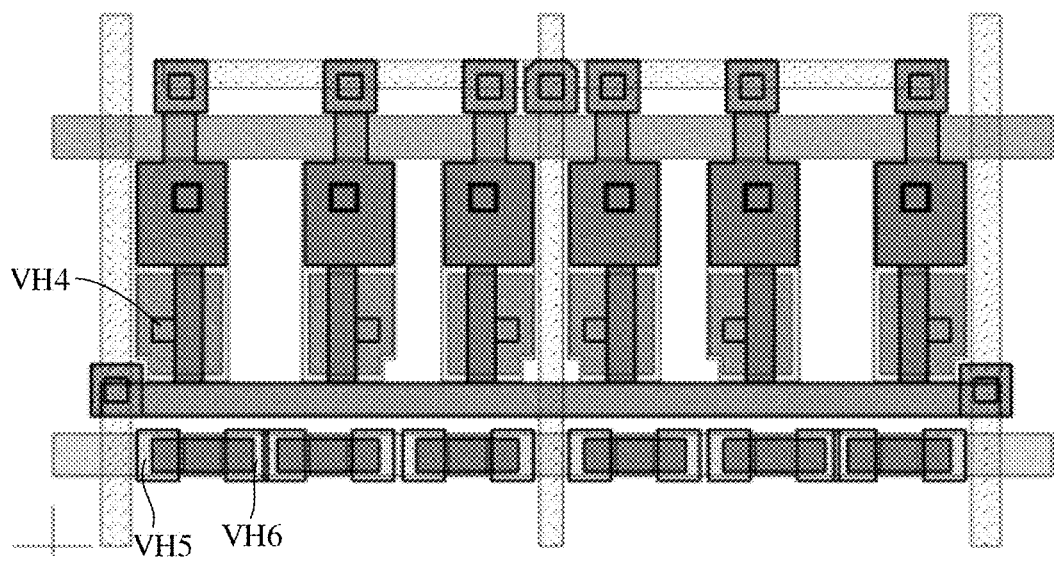
Figure 10:
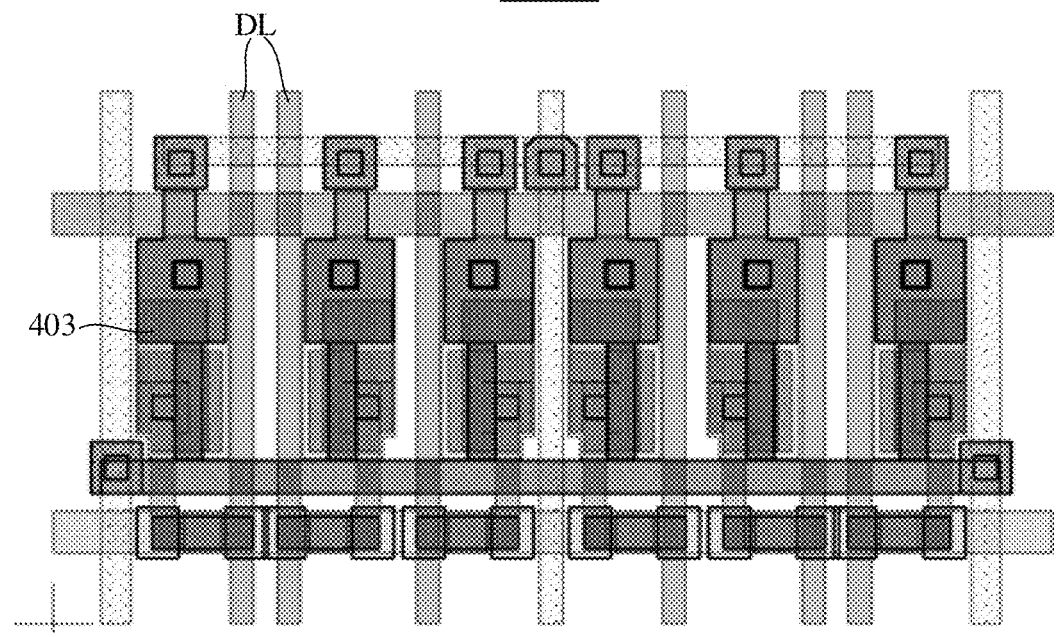
Figure 11:
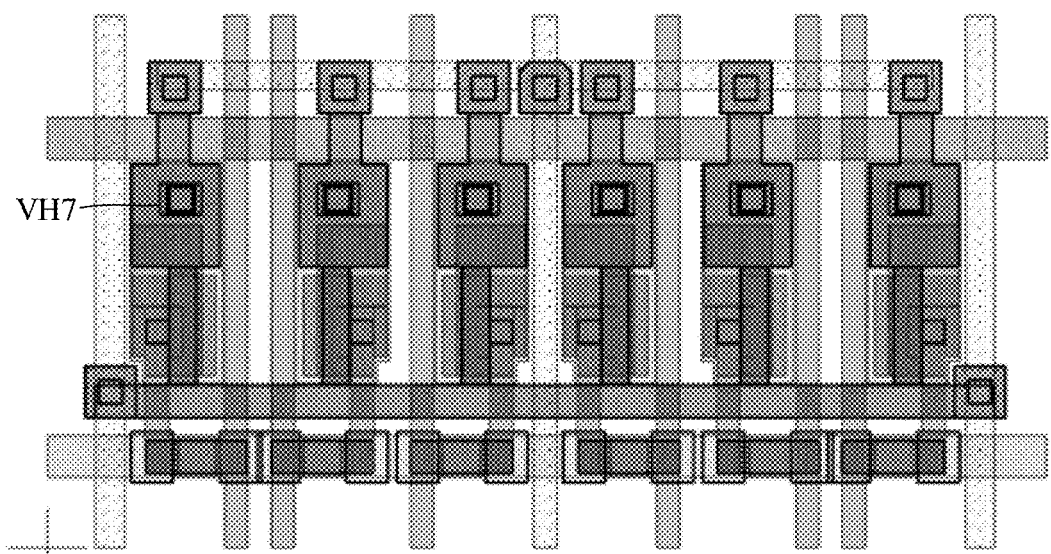
Figure 12:
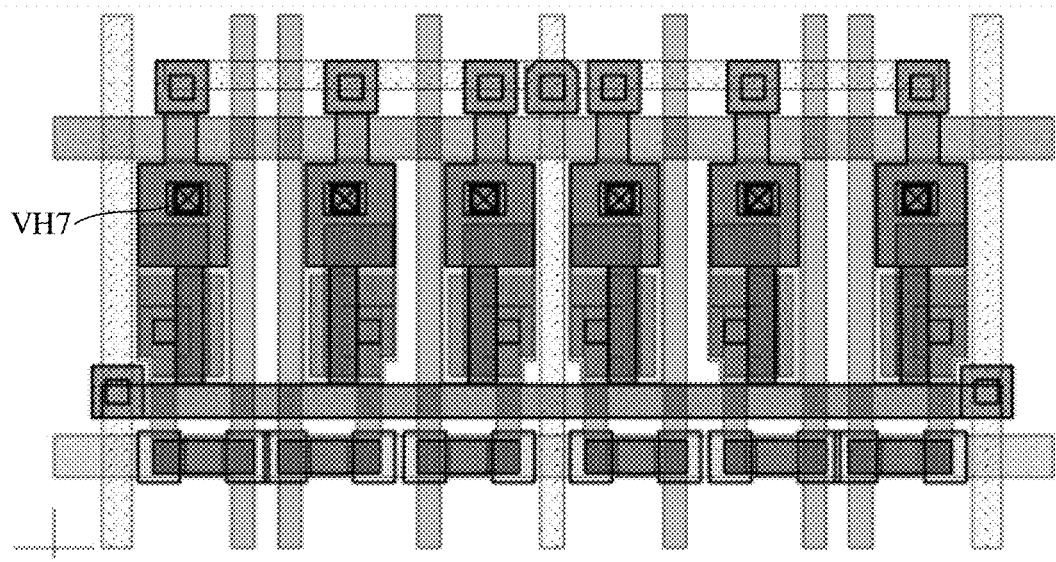
Figure 13:
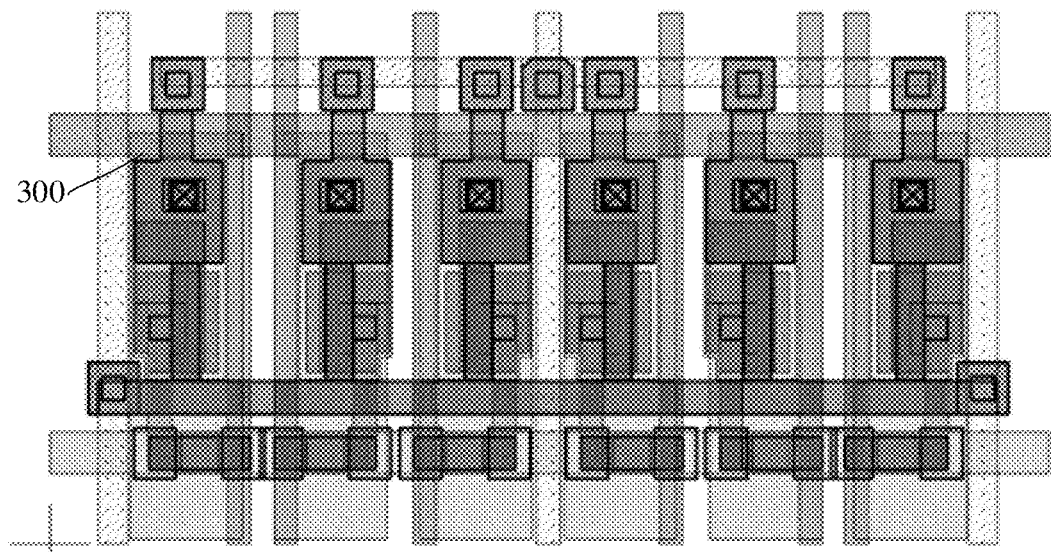

Referring to FIG. 3 to FIG. 13 in combination, the display substrate may include a plurality of conductive layers, a semiconductor layer and a plurality of insulating layers. For the convenience of description, the plurality of conductive layers are described as a first conductive layer, a second conductive layer, a third conductive layer and a fourth conductive layer. For example, FIG. 4 shows a part of the third conductive layer 30. FIG. 5 shows a part of the first conductive layer 10 and a part of the third conductive layer 30. The first conductive layer 10 may be a film layer where the gate electrodes of some transistors of the first scanning signal line GL1 and the first conductive portion are located, for example, which may be a conductive layer formed of a gate material. FIG. 6 schematically shows a plurality of via holes exposing a part of the third conductive layer 30 and the first conductive layer 10. On the basis of FIG. 4 to FIG. 6, FIG. 7 further shows a semiconductor layer ACT, in which the active layers of various transistors may be located. It should be noted that a part of the semiconductor layer ACT may have a semiconductor property to form a channel region of each transistor, and the other part of the semiconductor layer ACT may be conductorized to have a conductor property so as to form a source region and a drain region of each transistor and other conductive portions. On the basis of FIG. 4 to FIG. 7, FIG. 8 further shows a part of the second conductive layer 20. The gate electrodes of some transistors and the second scanning signal line GL2 may be located in the second conductive layer 20. For example, the second conductive layer 20 may be a conductive layer formed of a gate material. FIG. 9 schematically shows a plurality of via holes exposing a part of the second conductive layer 20. On the basis of FIG. 4 to FIG. 9, FIG. 10 further shows a part of the fourth conductive layer 40. The fourth conductive layer 40 may be a film layer where the data line DL, the conductive portion, etc. are located, that is, it may be a conductive layer formed of a source/drain material. FIG. 11 schematically shows a plurality of via holes exposing a part of the fourth conductive layer 40. FIG. 12 schematically shows a via hole that exposes a part of the semiconductor layer ACT to electrically connect the first electrode of the light emitting element. On the basis of FIG. 4 to FIG. 12, FIG. 13 further shows a part of a layer where the first electrode of the light emitting element is located, for example, it may be a conductive layer formed of a transparent conductive material such as ITO.

For example, the third conductive layer 30, the first conductive layer 10, the semiconductor layer ACT, the second conductive layer 20, the fourth conductive layer 40 and the first electrode may be sequentially stacked on the base substrate of the display substrate. Specifically, the third conductive layer 30 may be arranged on the base substrate, the first conductive layer 10 is arranged on a side of the third conductive layer 30 away from the base substrate, the semiconductor layer ACT is arranged on a side of the first conductive layer 10 away from the base substrate, the second conductive layer 20 is arranged on a side of the semiconductor layer ACT away from the base substrate, the fourth conductive layer 40 is arranged on a side of the second conductive layer 20 away from the base substrate, and the first electrode is arranged on a side of the fourth conductive layer 40 away from the base substrate. A stack relationship of the film layers will be described in more detail below with reference to the cross-sectional view.

It should be understood that the display substrate may further include a plurality of insulating layers located between any adjacent two of the base substrate 100, the third conductive layer 30, the first conductive layer 10, the semiconductor layer ACT, the second conductive layer 20 and the fourth conductive layer 40. These insulating layers will be described hereinafter with reference to cross-sectional view. In the insulating layers, a via hole or groove exposing at least a part of one of the third conductive layer 30, the first conductive layer 10, the semiconductor layer ACT, the second conductive layer 20 and the fourth conductive layer 40 may be formed to allow an electrical connection of components located in different film layers.

The display substrate may include a plurality of signal lines. Referring to FIG. 2B and FIG. 3 in combination, the plurality of signal lines may include a first scanning signal line GL1, a second scanning signal line GL2, a data line DL, a first power signal line VDD and a sensing signal line SL. The first power signal line VDD and the sensing signal line SL may be located in the third conductive layer 30, the first scanning signal line GL1 may be located in the first conductive layer 10, the second scanning signal line GL2 may be located in the second conductive layer 20, and the data line DL may be located in the fourth conductive layer 40.

In the embodiments shown in FIG. 3, the first scanning signal line GL1, the second scanning signal line GL2 and a part of the sensing signal line SL may extend substantially in the first direction X, while the data line DL, the first power signal line VDD and the other part of the sensing signal line SL may extend substantially in the second direction Y. For example, in the second direction Y, the second scanning signal line GL2 may be located between the first scanning signal line GL1 and a part of the sensing signal line SL.

Referring to FIG. 2B to FIG. 4 in combination, in the display substrate according to the embodiments of the present disclosure, the first power signal line VDD and the sensing signal line SL are located in the third conductive layer 30. The first power signal line VDD and the sensing signal line SL are spaced apart from each other. The sensing signal line SL may be located between two adjacent first power signal lines VDD. For example, the first power signal line VDD extends in the second direction Y. The sensing signal line SL may include a first part extending substantially in the first direction X and a second part extending substantially in the second direction Y.

Referring to FIG. 2B to FIG. 5 in combination, the display substrate may include a first conductive portion 101. The first scanning signal line GL1 and the first conductive portion 101 are located in the first conductive layer 10, and the first scanning signal line GL1 and the first conductive portion 101 are spaced apart from each other. For example, the first scanning signal line GL1 may extend substantially in the first direction X, and the first conductive portion 101 may extend substantially in the second direction Y. For example, at least three first conductive portions 101 may be provided between adjacent first power signal line VDD and sensing signal line SL, and these three first conductive portions 101 are spaced apart from each other. A part of the first scanning signal line GL1 may form the first gate electrode of the switching transistor T1, and a part of the first conductive portion 101 may form a plate of the storage capacitor Cst1.

Referring to FIG. 2B to FIG. 6 in combination, the display substrate may include a plurality of via holes exposing a part of the third conductive layer 30 and the first conductive layer 10. For example, the plurality of via holes include a via hole VH1 exposing the first power signal line VDD, a via hole VH2 exposing the sensing signal line SL, and a via hole VH3 exposing the first conductive portion 101, so that a conductive component formed subsequently may be electrically connected to the parts exposed by these via holes.

Referring to FIG. 2B to FIG. 7 in combination, the display substrate further includes a first active layer ACT1, a second active layer ACT2, a third active layer ACT3, a fourth conductive portion ACT4 and a fifth conductive portion ACT5 located in the semiconductor layer ACT. For example, the second active layer ACT2, the third active layer ACT3, the fourth conductive portion ACT4 and the fifth conductive portion ACT5 may be formed as an integral part continuously extending in the semiconductor layer ACT. The first active layer ACT1 is spaced apart from the integral part.

For example, the first active layer ACT1 extends in the first direction X, and an orthographic projection of the first active layer ACT1 on the base substrate may fall within an orthographic projection of the first scanning signal line GL1 on the base substrate. A plurality of first active layers ACT1 may be arranged at intervals in the first direction X.

For example, the fifth conductive portion ACT5 may extend substantially in the first direction X. A part of the fifth conductive portion ACT5 may be electrically connected to a first power signal line VDD on one side through a via hole VH1, and the other part of the fifth conductive portion ACT5 may be electrically connected to a first power signal line VDD on the other side through another via hole VH1. For example, the fifth conductive portion ACT5 may be located on a side of the second active layer ACT2 away from the fourth conductive portion ACT4.

A part of the fourth conductive portion ACT4 may be electrically connected to the first conductive portion 101 through the via hole VH3. An orthographic projection of the fourth conductive portion ACT4 on the base substrate may at least partially overlap an orthographic projection of the first conductive portion 101 on the base substrate. For example, the orthographic projection of the fourth conductive portion ACT4 on the base substrate may fall within the orthographic projection of the first conductive portion 101 on the base substrate.

For example, in the second direction Y, the fourth conductive portion ACT4 may be located between the second active layer ACT2 and the third active layer ACT3. A part of the third active layer ACT3 may be electrically connected to the sensing signal line SL through the via hole VH2.

In the embodiments of the present disclosure, an overlapping part of the first scanning signal line GL1 and the first active layer ACT1 may form the first gate electrode G1 of the switching transistor T1.

Referring to FIG. 2B to FIG. 8, the display substrate includes a second scanning signal line GL2, a second conductive portion 202 and a channel defining portion 200 located in the second conductive layer 20. The second scanning signal line GL2, the second conductive portion 202 and the channel defining portion 200 are spaced apart from each other.

For example, the second scanning signal line GL2 is arranged parallel to the first scanning signal lines GL1, that is, they both extend in the first direction X.

An overlapping part of the second conductive portion 202 and the second active layer ACT2 forms the second gate electrode G2 of the driving transistor T2. An overlapping part of the second scanning signal line GL2 and the third active layer ACT3 forms the third gate electrode G3 of the sensing transistor.

In the embodiments of the present disclosure, the channel defining portion 200 is used to define a channel region of the switching transistor T1, and the channel defining portion 200 is located in the second conductive layer 20. Referring to FIG. 8, an orthographic projection of the channel defining portion 200 on the base substrate at least partially overlaps an orthographic projection of the first active layer ACTT on the base substrate. The orthographic projection of the channel defining portion 200 on the base substrate falls within an orthographic projection of the first gate electrode G1 or the first scanning signal line GL1 on the base substrate.

Herein, the expression "the channel defining portion 200 is used to define a channel region of the switching transistor T1" means that the orthographic projection of the channel defining portion 200 on the base substrate is substantially coincident with an orthographic projection of the channel region of the switching transistor T1 on the base substrate.

Referring to FIG. 2B to FIG. 9, the display substrate may include a via hole VH4 exposing the second conductive portion 202 and via holes VH5 and VH6 respectively exposing source and drain regions of the first active layer ACT1, so that a conductive component formed subsequently are electrically connected to the parts exposed by these via holes.

Referring to FIG. 2B to FIG. 10 in combination, the display substrate includes a data line DL and a third conductive portion 403 located in the fourth conductive layer 40. The data line DL is spaced apart from the third conductive portion 403.

For example, the data line DL may extend in the second direction Y, and at least three data lines DL may be provided between adjacent first power signal line VDD and sensing signal line SL.

For example, a part of the third conductive portion 403 is electrically connected to one end of the first active layer ACTT through the via hole VH5, and a part of the data line DL is electrically connected to the other end of the first active layer ACTT through the via hole VH6.

For example, a part of the third conductive portion 403 is electrically connected to the second conductive portion 202 through the via hole VH4.

For example, an orthographic projection of the third conductive portion 403 on the base substrate at least partially overlaps the orthographic projection of the first conductive portion 101 on the base substrate. A part of the third conductive portion 403 is arranged across the fifth conductive portion ACT5. For example, the fifth conductive portion ACT5 extends in the first direction X, and the part of the third conductive portion 403 arranged across the fifth conductive portion ACT5 extends in the second direction Y. The via hole VH4 and the via hole VH5 are located on opposite sides of the fifth conductive portion ACT5. For example, the via hole VH4 and the via hole VH5 may be substantially aligned in the second direction Y.

Referring to FIG. 2B to FIG. 12 in combination, the display substrate may include a via hole VH7. For example, the via hole VH7 may penetrate through a passivation layer and a planarization layer to expose a part of the fourth conductive portion ACT4, so that the first electrode of the light emitting element formed subsequently may be electrically connected to the fourth conductive portion.

Referring to FIG. 2B to FIG. 13 in combination, a first electrode 300, such as the anode of the light emitting element, is schematically shown. The first electrode 300 may be electrically connected to the fourth conductive portion ACT4 through the via hole VH7.

Referring to FIG. 2B to FIG. 13 in combination, a pixel opening 400 is schematically shown. For example, the pixel opening 400 may be defined by a pixel defining layer located on a side of the first electrode 300 away from the base substrate.

Figure 14:
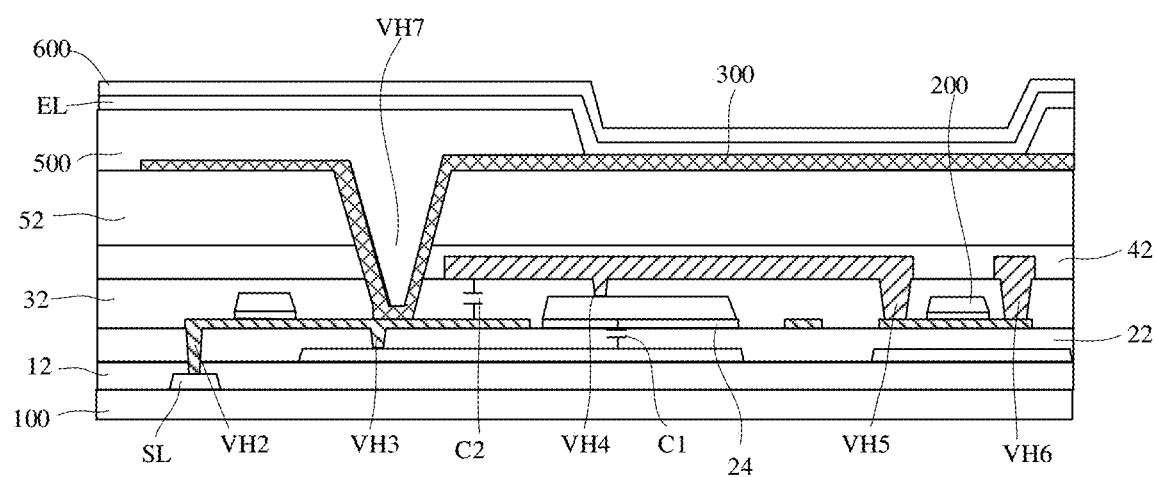
FIG. 14 shows a cross-sectional view taken along line AA' in FIG. 3.

FIG. 14 shows a cross-sectional view taken along line AA' in FIG. 3. Referring to FIG. 2B to FIG. 14 in combination, the display substrate may include a base substrate 100, a third conductive layer 30 arranged on the base substrate 100, a buffer layer 12 arranged on a side of the third conductive layer 30 away from the base substrate 100, a first conductive layer 10 arranged on a side of the buffer layer 12 away from the base substrate 100, a first gate insulating layer 22 arranged on a side of the first conductive layer 10 away from the base substrate 100, a semiconductor layer ACT arranged on a side of the first gate insulating layer 22 away from the base substrate 100, a second gate insulating layer 24 arranged on a side of the semiconductor layer ACT away from the base substrate 100, a second conductive layer 20 arranged on a side of the second gate insulating layer 24 away from the base substrate 100, an interlayer dielectric layer 32 arranged on a side of the second conductive layer 20 away from the base substrate 100, a fourth conductive layer 40 arranged on a side of the interlayer dielectric layer 32 away from the base substrate 100, a first insulating layer 42 arranged on a side of the fourth conductive layer 40 away from the base substrate 100, a second insulating layer 52 arranged on a side of the first insulating layer 42 away from the base substrate 100, a first electrode 300 arranged on a side of the second insulating layer 52 away from the base substrate 100, a pixel defining layer 500 arranged on a side of the first electrode 300 away from the base substrate 100, a luminescent material layer EL arranged on a side of the pixel defining layer 500 away from the base substrate 100, and a second electrode 600 arranged on a side of the luminescent material layer EL away from the base substrate 100.

It should be noted that each of the above-mentioned insulating layers may include a single-layer structure or a stacked-layer structure composed of a plurality of insulating layers. For example, the first insulating layer 42 may include two passivation layers, and the second insulating layer 52 may include one passivation layer and one planarization layer.

Referring to FIG. 2B to FIG. 14 in combination, in the embodiments of the present disclosure, the switching transistor T1 included in the display substrate has a bottom gate structure, that is, the first gate electrode G1 of the switching transistor T1 is located on a side of the first active layer ACT1 close to the base substrate 100; the driving transistor T2 and the sensing transistor T3 have a top gate structure, that is, the second gate electrode G2 of the driving transistor T2 is located on a side of the second active layer ACT2 away from the base substrate 100, and the third gate electrode G3 of the sensing transistor T3 is located on a side of the third active layer ACT3 away from the base substrate 100. In addition, a channel defining portion 200 is further provided for the switching transistor T1 having the bottom gate structure. The channel defining portion 200 is located in the same layer as the gate electrodes G2 and G3 of the driving transistor T2 and the sensing transistor T3 having the top gate structure. In this way, when performing a conductorization process on the semiconductor layer, the conductorization process may be performed by using the channel defining portion 200 as a mask, so that a part of the first active layer ACT1 not covered by the channel defining portion 200 is conductorized, and a part of the first active layer ACT1 covered by the channel defining portion 200 forms the channel region of the switching transistor T1. That is, the channel region of the switching transistor T1 may be formed through a self-alignment of the channel defining portion 200. In other words, the switching transistor T1 having the bottom gate structure as well as the driving transistor T2 and the sensing transistor T3 having the top gate structure may form the channel region through the same conductorization process, which is beneficial to save process steps. Moreover, in this way, a good property of the formed switching transistor T1 may be ensured. In addition, in the embodiments of the present disclosure, the use of the top gate structure for the driving transistor and the sensing transistor may save a distance arrangement in the second direction Y, which is beneficial to increase a width of the first scanning signal line, so as to reduce a load on the first scanning signal line, and then match a higher refresh rate.

For example, the channel defining portion 200 is in a suspended state. That is, the channel defining portion 200 may not receive an electrical signal.

In the embodiments of the present disclosure, the storage capacitor includes a first capacitor C1 and a second capacitor C2, and the first capacitor and the second capacitor may be connected in parallel to increase a capacitance value of the storage capacitor. Referring to FIG. 2B to FIG. 14 in combination, the display substrate includes the first conductive portion 101 located in the first conductive layer and the second conductive portion 202 located in the second conductive layer. An orthographic projection of at least a part of the first conductive portion 101 on the base substrate overlaps an orthographic projection of at least a part of the second conductive portion 202 on the base substrate, and an overlapping part of the first conductive portion 101 and the second conductive portion 202 forms the capacitor C1. The display substrate further includes the third conductive portion 403 located in the fourth conductive layer 40 and the fourth conductive portion ACT4 located in the semiconductor layer ACT, and the fourth conductive portion ACT4 includes a conductorized part in the semiconductor layer ACT. An orthographic projection of at least a part of the third conductive portion 403 on the base substrate overlaps an orthographic projection of at least a part of the fourth conductive portion ACT4 on the base substrate, and an overlapping part of the third conductive portion 403 and the fourth conductive portion ACT4 forms the second capacitor C2. For example, the fourth conductive portion ACT4 is electrically connected to the first conductive portion through the via hole VH3, and the third conductive portion 403 is electrically connected to the second conductive portion 202 through the via hole VH4.

For example, a part of the third active layer ACT3 is electrically connected to the sensing signal line SL through the via hole VH2, and a part of the fifth conductive portion ACT5 is electrically connected to the first power signal line VDD through the via hole VH1.

For example, the first electrode 300 is directly electrically connected to the fourth conductive portion ACT4 through the via hole VH7. For example, an orthographic projection of the via hole VH7 on the base substrate at least partially overlaps an orthographic projection of the via hole VH3 on the base substrate.

In the embodiments of the present disclosure, since the first electrode 300 is formed of a material with a strong grade ability, such as ITO, the first electrode 300 may be directly electrically connected to the conductive component located in the semiconductor layer through the via hole VH7, so as to save a wiring space and save more space for the storage capacitor, which may help increase the capacitance value of the storage capacitor.

Optionally, the embodiments of the present disclosure further provide a display device that may include the display substrate described above. The display device may include but not be limited to any product or component with a display function, such as electronic paper, mobile phone, tablet computer, television, display, notebook computer, digital photo frame, navigator, etc. It should be understood that the display device has the same beneficial effects as the display substrate provided in the foregoing embodiments.

Although some embodiments according to the general concept of the present disclosure have been illustrated and described, it should be understood by those ordinary skilled in the art that these embodiments may be changed without departing from the principle and spirit of the general inventive concept of the present disclosure. The scope of the present disclosure is defined by the claims and their equivalents.

What is claimed is:

1. A display substrate, comprising:
a base substrate;
a plurality of pixel units arranged on the base substrate, wherein each pixel unit comprises a plurality of sub-pixels, and each sub-pixel comprises a light emitting element and a pixel driving circuit for driving the light emitting element;
a semiconductor layer arranged on the base substrate;
a first conductive layer arranged on a first side of the semiconductor layer close to the base substrate; and
a second conductive layer arranged on a second side of the semiconductor layer away from the base substrate,
wherein:
the pixel driving circuit comprises at least a driving transistor, a switching transistor and a sensing transistor;
the switching transistor comprises a first gate electrode located in the first conductive layer and a first active layer located in the semiconductor layer;
the driving transistor comprises a second gate electrode located in the second conductive layer and a second active layer located in the semiconductor layer;
the sensing transistor comprises a third gate electrode located in the second conductive layer and a third active layer located in the semiconductor layer; and
the display substrate further comprises a channel defining portion for defining a channel region of the switching transistor, the channel defining portion is located in the second conductive layer, the channel defining portion, the second gate electrode and the third gate electrode are located in the same layer and are spaced apart from each other, and an orthographic projection of the channel defining portion on the base substrate at least partially overlaps an orthographic projection of the first active layer on the base substrate.

2. The display substrate of claim 1, wherein the orthographic projection of the channel defining portion on the base substrate falls within an orthographic projection of the first gate electrode on the base substrate.

3. The display substrate of claim 1, wherein the first active layer extends in a first direction, and the second active layer and the third active layer extend in a second direction intersecting the first direction.

4. The display substrate of claim 3, further comprising a first power signal line for transmitting a first power signal, wherein the display substrate further comprises a third conductive layer located on a side of the first conductive layer close to the base substrate, and the first power signal line is located in the third conductive layer.

5. The display substrate of claim 4, further comprising a sensing signal line for transmitting a sensing signal, wherein the sensing transistor comprises a source electrode and a drain electrode, the sensing signal line is electrically connected to the source electrode or the drain electrode of the sensing transistor, and the sensing signal line is located in the third conductive layer.

6. The display substrate of claim 3, wherein the pixel driving circuit further comprises a storage capacitor comprising a first capacitor; and
wherein the display substrate comprises a first conductive portion located in the first conductive layer and a second conductive portion located in the second conductive layer, an orthographic projection of at least a part of the first conductive portion on the base substrate overlaps an orthographic projection of at least a part of the second conductive portion on the base substrate, and an overlapping part of the first conductive portion and the second conductive portion forms the first capacitor.

7. The display substrate of claim 3, wherein:
the storage capacitor further comprises a second capacitor connected in parallel with the first capacitor;
the display substrate further comprises a fourth conductive layer located on a side of the second conductive layer away from the base substrate;
the display substrate further comprises a third conductive portion located in the fourth conductive layer and a fourth conductive portion located in the semiconductor layer, and the fourth conductive portion comprises a conductorized part in the semiconductor layer; and
an orthographic projection of at least a part of the third conductive portion on the base substrate overlaps an orthographic projection of at least a part of the fourth conductive portion on the base substrate, and an overlapping part of the third conductive portion and the fourth conductive portion forms the second capacitor.

8. The display substrate of claim 7, wherein the fourth conductive portion is electrically connected to the first conductive portion through a first via hole, and the third conductive portion is electrically connected to the second conductive portion through a second via hole.

9. The display substrate of claim 8, further comprising a first scanning signal line located in the first conductive layer, wherein the first scanning signal line is spaced apart from the first conductive portion; and
wherein an overlapping part of the first scanning signal line and the semiconductor layer forms the first gate electrode.

10. The display substrate of claim 9, wherein the first scanning signal line and the sensing signal line extend in the first direction; and/or the first power signal line and the first conductive portion extend in the second direction.

11. The display substrate of claim 7, further comprising a fifth conductive portion located in the semiconductor layer;

wherein the second active layer, the third active layer, the fourth conductive portion and the fifth conductive portion are formed as an integral part continuously extending in the semiconductor layer; and wherein the first active layer is spaced apart from the integral part.

12. The display substrate of claim 11, wherein a part of the third active layer is electrically connected to the sensing signal line through a third via hole, and a part of the fifth conductive portion is electrically connected to the first power signal line through a four via hole.

13. The display substrate of claim 8, further comprising a second scanning signal line located in the second conductive layer, wherein the second scanning signal line is arranged parallel to the first scanning signal line; wherein the second scanning signal line, the second conductive portion and the channel defining portion are spaced apart from each other; and an overlapping part of the second conductive portion and the second active layer forms the second gate electrode, and an overlapping part of the second scanning signal line and the third active layer forms the third gate electrode.

14. The display substrate of claim 10, further comprising a data line located in the fourth conductive layer;

wherein the data line is spaced apart from the third conductive portion; and wherein a part of the third conductive portion is electrically connected to one end of the first active layer through a fifth via hole, and a part of the data line is electrically connected to the other end of the first active layer through a sixth via hole.

15. The display substrate of claim 14, wherein an orthographic projection of the second conductive portion on the base substrate falls within an orthographic projection of the first conductive portion on the base substrate; and/or wherein a part of the third conductive portion is arranged across the fifth conductive portion.

16. The display substrate of claim 15, wherein the fifth conductive portion extends in the first direction, the part of the third conductive portion arranged across the fifth conductive portion extends in the second direction, and the second via hole and the fifth via hole are located on opposite sides of the fifth conductive portion.

17. The display substrate of claim 7, wherein the light emitting element comprises a first electrode directly electrically connected to the fourth conductive portion through a seventh via hole.

18. The display substrate of claim 17, wherein an orthographic projection of the seventh via hole on the base substrate at least partially overlaps an orthographic projection of the second via hole on the base substrate.

19. The display substrate of claim 1, wherein the channel defining portion is in a suspended state.

20. A display device comprising the display substrate of claim 1.

* * * * *